(12) United States Patent
Lee et al.

(10) Patent No.: US 11,223,001 B2
(45) Date of Patent: Jan. 11, 2022

(54) ELECTRODE SUBSTRATE FOR TRANSPARENT LIGHT-EMITTING DIODE DISPLAY DEVICE, AND TRANSPARENT LIGHT-EMITTING DIODE DISPLAY DEVICE COMPRISING SAME

(71) Applicant: LG CHEM, LTD., Seoul (KR)

(72) Inventors: Kun Seok Lee, Daejeon (KR); Yong Goo Son, Daejeon (KR); Kiseok Lee, Daejeon (KR); Seung Heon Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 16/971,933

(22) PCT Filed: Aug. 20, 2019

(86) PCT No.: PCT/KR2019/010546
§ 371 (c)(1),
(2) Date: Aug. 21, 2020

(87) PCT Pub. No.: WO2020/040516
PCT Pub. Date: Feb. 27, 2020

(65) Prior Publication Data
US 2021/0074895 A1 Mar. 11, 2021

(30) Foreign Application Priority Data
Aug. 24, 2018 (KR) .......................... 10-2018-0099184

(51) Int. Cl.
*H01L 33/62* (2010.01)
*H01L 25/075* (2006.01)

(52) U.S. Cl.
CPC .......... *H01L 33/62* (2013.01); *H01L 25/0753* (2013.01)

(58) Field of Classification Search
CPC ..... H01L 33/62; H01L 25/0753; H01L 33/38; H01L 33/40; H01L 27/15; H01L 27/156
See application file for complete search history.

(56) References Cited

U.S. PATENT DOCUMENTS

| 6,097,351 A | 8/2000 | Nishida |
| 2015/0062453 A1* | 3/2015 | Kim ..................... G06F 3/0448 349/12 |

(Continued)

FOREIGN PATENT DOCUMENTS

| KR | 10-1105887 B1 | 1/2012 |
| KR | 20160103818 A | 9/2016 |

(Continued)

*Primary Examiner* — Victor A Mandala
(74) *Attorney, Agent, or Firm* — Dentons US LLP

(57) ABSTRACT

An electrode substrate for a transparent light emitting device display according to an embodiment of the this application comprises: a transparent substrate; (M rows×N columns) light emitting device pad portions provided on the transparent substrate as a matrix; and a first common electrode wiring portion, a second common electrode wiring portion, and a signal electrode wiring portion which are provided on the transparent substrate and connected to the light emitting device pad portions, respectively, in which each of the first common electrode wiring portion, the second common electrode wiring portion, and the signal electrode wiring portion comprises a metal mesh pattern, and line resistance of the first common electrode wiring portion or the second common electrode wiring portion connected to the light emitting device pad portions constituting one row among the light emitting device pad portions satisfies Equation 1 above.

17 Claims, 3 Drawing Sheets

(56) References Cited

U.S. PATENT DOCUMENTS

| | | |
|---|---|---|
| 2016/0245491 A1 | 8/2016 | Kim |
| 2017/0031217 A1* | 2/2017 | Jung ................ G02F 1/133512 |
| 2017/0179356 A1 | 6/2017 | Rogers et al. |
| 2018/0049318 A1 | 2/2018 | Maki |
| 2018/0072019 A1 | 3/2018 | Shimoji et al. |
| 2019/0385513 A1* | 12/2019 | Iguchi ....................... G09F 9/00 |

FOREIGN PATENT DOCUMENTS

| | | |
|---|---|---|
| KR | 10-1689131 B1 | 12/2016 |
| KR | 20170021417 A | 2/2017 |
| KR | 20170031963 A | 3/2017 |
| KR | 10-1789139 B1 | 10/2017 |
| KR | 20170140197 A | 12/2017 |
| WO | 2016178322 A1 | 10/2016 |

\* cited by examiner

[Figure 1]
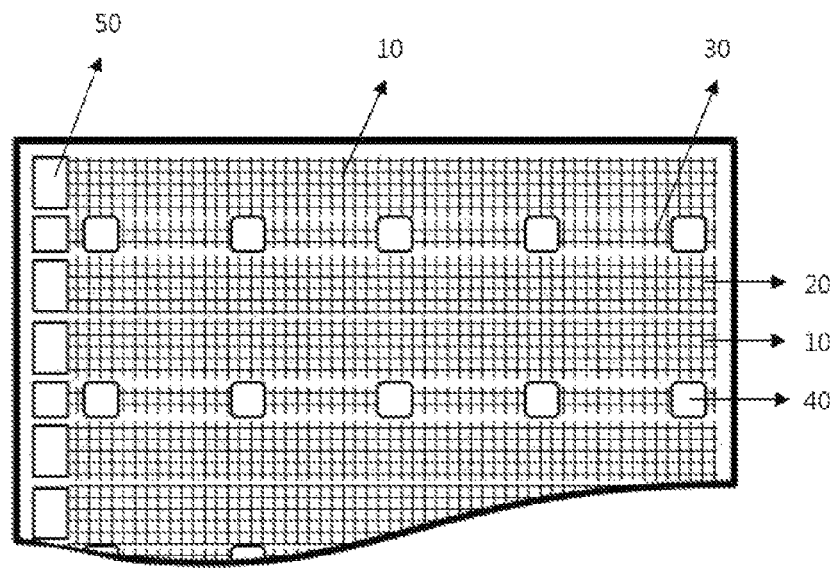
[Figure 2]
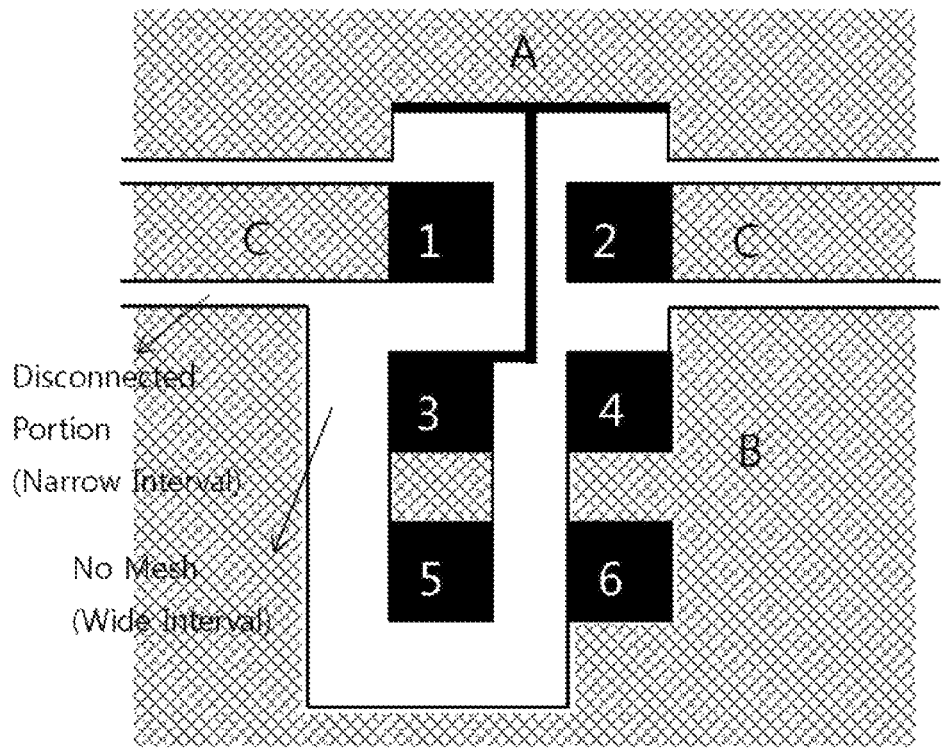

[Figure 3]
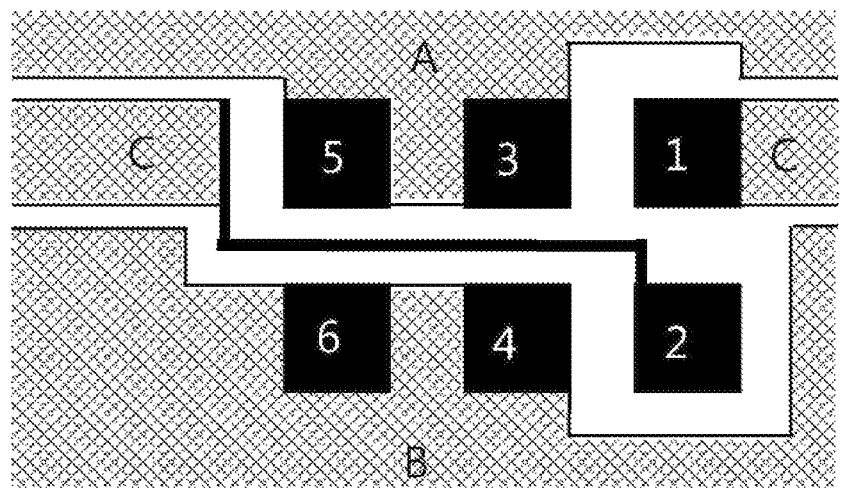
[Figure 4]
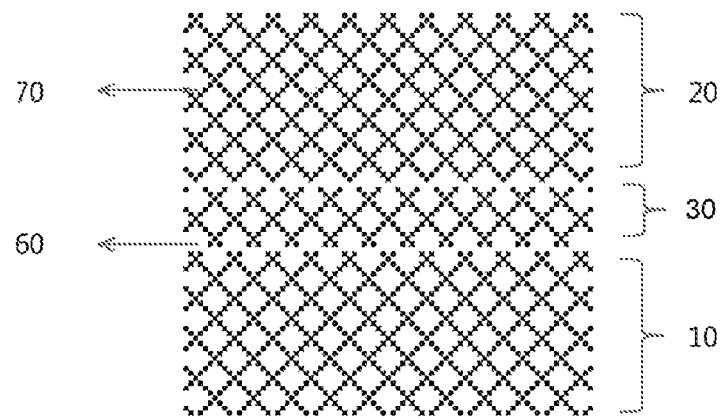

[Figure 5 - RELATED ART]
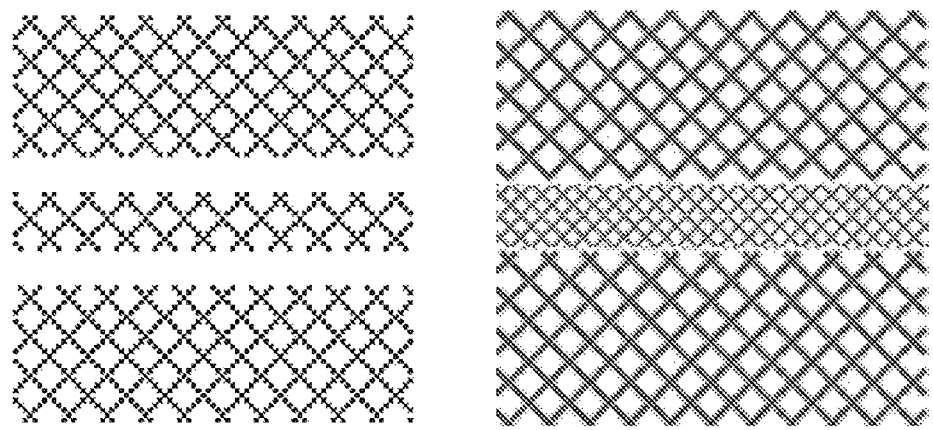
[Figure 6]
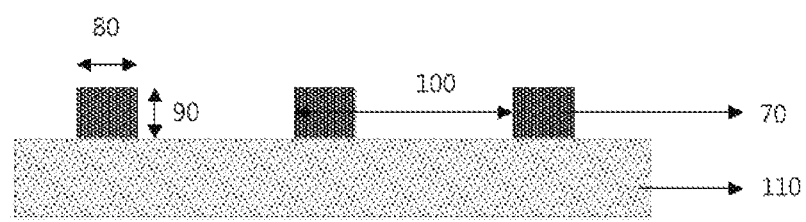

ELECTRODE SUBSTRATE FOR TRANSPARENT LIGHT-EMITTING DIODE DISPLAY DEVICE, AND TRANSPARENT LIGHT-EMITTING DIODE DISPLAY DEVICE COMPRISING SAME

CROSS-REFERENCE TO RELATED APPLICATIONS

This application is a national stage of international Application No. PCT/KR2019/010546, filed on Aug. 20, 2019, and claims priority to and the benefit of Korean Patent Application No. 10-2018-0099184 filed in the Korean Intellectual Property Office on Aug. 24, 2018, the entire contents of which are incorporated herein by reference.

TECHNICAL FIELD

This application relates to an electrode substrate for a transparent light emitting device display and a transparent light emitting device display comprising the same.

BACKGROUND

Recently in Korea, only colorful signs and a variety of outdoor lighting are produced in parks and downtown through the fusion of advanced ICT technologies and LED technologies to provide information and attractions to citizens. In particular, a transparent LED display using a transparent electrode material in which an LED is applied between two glass layers can produce luxurious effects by invisible wires. As a result, the transparent LED is used for an interior design in hotels, department stores, etc., and has a growing importance in implementing media facades of exterior walls of buildings.

A demand for a transparent electrode which is transparent and is electrically charged and is used for a touch screen exponentially increases as smart devices are spread and a transparent electrode which is most commonly used among the transparent electrodes is indium tin oxide (ITO) which is an oxide of indium and tin. However, indium which is a main raw material of an ITO transparent electrode material is not widely available in worldwide reserves, and is produced only in some countries such as China, and the like, and has high production cost. Further, a resistance value is high and is not constantly applied to the ITO, and as a result, LED light is not expressed at a desired luminance and is not constant. As a result, the transparent LED utilizing the ITO has a limit in being used as a transparent electrode material having high performance and low cost.

It is true that ITO is the most commonly used transparent electrode material, but research and technology development utilizing a new material is continuously made due to economic limits and limited performance. A transparent electrode material that is attracting attention as a next-generation new material can comprise a metal mesh (Mesh Metal), a nanowire (Ag nanowire), carbon nanotubes (CNT), a conductive polymer, graphene, and the like. Among them, the metal mesh as a new material, which accounts for 85% of materials to replace the ITO, has low cost and high conductivity, and as a result, a market of the metal mesh has been expanded in terms of utilization.

The transparent LED display utilizing the metal mesh is excellent in conductivity, is easier to maintain, contributes to resource saving and prevents environmental contamination, and is economical due to reduction of manufacturing cost compared with the existing transparent display. Further, the transparent LED display can be expanded and applied to various uses, and as a result, there is a possibility in applying and utilizing the transparent LED display to and for various products as a new transparent electrode material.

SUMMARY

This application has been made in an effort to provide a transparent light emitting device display using a metal mesh pattern.

An embodiment of this application provides an electrode substrate for a transparent light emitting device display, comprising: a transparent substrate; (M rows×N columns) light emitting device pad portions provided on the transparent substrate as a matrix; a first common electrode wiring portion, a second common electrode wiring portion, and a signal electrode wiring portion which are provided on the transparent substrate and connected to the light emitting device pad portions, respectively, in which each of the first common electrode wiring portion, the second common electrode wiring portion, and the signal electrode wiring portion comprises a metal mesh pattern, and line resistance of the first common electrode wiring portion or the second common electrode wiring portion connected to the light emitting device pad portion constituting one row among the light emitting device pad portions satisfies Equation 1 below:

$$R < (200/N) - 0.4. \qquad \text{[Equation 1]}$$

In Equation 1 above, R is a line resistance (Ω) of the first common electrode wiring portion or the second common electrode wiring portion, and N is a natural number of 1 or more.

Another embodiment of this application provides a transparent light emitting device display comprising the electrode substrate for the transparent light emitting device display.

According to an embodiment of this application, a metal mesh pattern in which the line width, the line height, and the pitch are the same is applied to the first common electrode wiring portion, the second common electrode wiring portion, and the signal electrode wiring portion to lower awareness of the wiring. Further, the metal mesh pattern is provided in an entire region of an effective screen part on a transparent substrate other than a region with a light emitting device to lower resistance by maximizing an extent of a common electrode wiring portion.

Further, according to an embodiment of this application, the width of the disconnection portion which respectively separates the metal mesh patterns of the first common electrode wiring portion, the second common electrode wiring portion, and the signal electrode wiring portion is minimized to lower awareness of the wiring.

BRIEF DESCRIPTION OF DRAWINGS

FIG. 1 is a schematic illustration of an electrode substrate for a transparent light emitting device display according to an embodiment of this application.

FIGS. 2 and 3 is a schematic illustration of an electrode pad portion of an electrode substrate for a transparent light emitting device display according to an embodiment of this application.

FIG. 4 is a schematic illustration of a metal mesh pattern according to an embodiment of this application.

FIG. 5 is a schematic illustration of a metal mesh pattern in the related art.

FIG. 6 is a schematic illustration of a line width, line height, and a pitch of a metal mesh pattern according to an embodiment of this application.

REFERENCE NUMERALS DESCRIBED HEREIN

10: First common electrode wiring portion
20: Second common electrode wiring portion
30: Signal electrode wiring portion
40: Light emitting device pad portion
50: FPCB pad portion
60: Disconnection portion
70: Metal mesh pattern
80: Line width of metal mesh pattern
90: Line height of metal mesh pattern
100: Pitch of metal mesh pattern
110: Transparent substrate

DETAILED DESCRIPTION

Hereinafter, this application will be described in detail.

In this application, "transparent" is supposed to mean that the "transparent" has a transmission property of approximately 80% or more in a visible ray region (400 to 700 nm).

A transparent LED display provides various attractions to citizens through an information providing service and landscape rendering and there is an increasing demand for transparent LED displays in various fields. Until now, it is true that the ITO is the most commonly used transparent electrode material, but research and technology development utilizing a new material is continuously made due to economic limits and limited performance.

More specifically, in implementing a transparent LED display in the related art, a transparent electrode wire is formed by introducing Ag nanowire or transparent metal oxide (ITO, IZO, etc.). However, since the Ag nanowire or transparent metal oxide (ITO, IZO, etc.) has a high resistance, the LED driving number is limited, and as a result, there is a limit in increasing an area of the transparent LED display. Further, to lower resistance, when a thickness of the Ag nanowire or the transparent metal oxide increases, there is poor transmittance of the transparent LED display.

Therefore, in this application, it is characterized in that a metal mesh pattern is applied to a transparent electrode wire of a transparent light emitting device display to provide a transparent light emitting device display having excellent resistance characteristic and visibility.

An electrode substrate for a transparent light emitting device display according to an embodiment of this application comprises: a transparent substrate; (M rows×N columns) light emitting device pad portions provided on the transparent substrate as a matrix; and a first common electrode wiring portion, a second common electrode wiring portion, and a signal electrode wiring portion which are provided on the transparent substrate and connected to the light emitting device pad portions, respectively, in which each of the first common electrode wiring portion, the second common electrode wiring portion, and the signal electrode wiring portion comprises a metal mesh pattern, and line resistance of the first common electrode wiring portion or the second common electrode wiring portion connected to the light emitting device pad portion constituting one row among the light emitting device pad portions satisfies Equation 1 above.

In an embodiment of this application, the light emitting device pad portion is a component provided at a location on which the light emitting device is mounted by using a solder and each light emitting device pad portion can comprise at least four electrode pad portions electrically connected to the first common electrode wiring portion, the second common electrode wiring portion, and the signal electrode wiring portion. In this case, the metal mesh pattern cannot be provided in at least a partial region among the at least four electrode pad portions as illustrated in FIGS. 2 and 3 described below.

In an embodiment of this application, (M rows×N columns) light emitting device pad portions can be provided on the transparent substrate as a matrix and the light emitting device pad portions constituting one row can be connected to the signal electrode wiring portion in series and connected to the first common electrode wiring portion and the second common electrode wiring portion in series. Accordingly, in an embodiment of this application, each of the signal electrode wiring portion, the first common electrode wiring portion, and the second common electrode wiring portion can be provided with N number. Further, in an embodiment of this application, the first common electrode wiring portion connected to the light emitting device pad portion constituting a first row and the first common electrode wiring portion connected to the light emitting device pad portion constituting a row different from the first row cannot be connected to each other. Further, in an embodiment of this application, the second common electrode wiring portion connected to the light emitting device pad portion constituting the first row and the second common electrode wiring portion connected to the light emitting device pad portion constituting the row different from the first row cannot be connected to each other. Further, in an embodiment of this application, the signal electrode wiring portion connected to the light emitting device pad portion constituting the first row and the signal electrode wiring portion connected to the light emitting device pad portion constituting the row different from the first row cannot be connected to each other.

Further, in an embodiment of this application, the first common electrode wiring portion, the second common electrode wiring portion, and the signal electrode wiring portion connected to the light emitting device pad portion constituting the first row cannot be respectively connected to each other. When any two of the first common electrode wiring portion, the second common electrode wiring portion, and the signal electrode wiring portion are connected to each other, an electrical short can occur.

The first common electrode wiring portion and the second common electrode wiring portion can provide a sufficient current amount to drive the light emitting device and in the case of sending a color signal of the light emitting device, the signal can be sent only with low current, and as a result, the first common electrode wiring portion and the second common electrode wiring portion can be connected to the signal electrode wiring portion in series.

The number of the light emitting device pad portions can be appropriately selected by those skilled in the art by considering a use of the transparent light emitting device display, etc., but is not particularly limited. More specifically, the number of light emitting device pad portions is associated with the resistance of the electrode, the electrode can sufficiently have low resistance and the larger the area of the display, the number of light emitting device pad portions can increase. When the number of light emitting device pad portions increases in the same area, the resolution becomes higher and when the number of light emitting device pad portions increases at the same interval, the area of the display increases, and as a result, a wire line of a power supply unit can be reduced. Therefore, the number of light emitting device pad portions can be appropriately selected by those skilled in the art by considering the use of the transparent light emitting device display. For example, each of the N and M can be a natural number of 1 or more or a natural number of 1 to 400, but is not particularly limited thereto.

In an embodiment of this application, the signal electrode wiring portion can be provided between the first common electrode wiring portion and the second common electrode wiring portion.

In an embodiment of this application, the first common electrode wiring portion can be a (+) common electrode wiring portion and the second common electrode wiring portion can be a (−) common electrode wiring portion. Further, the first common electrode wiring portion can be the (−) common electrode wiring portion and the second common electrode wiring portion can be the (+) common electrode wiring portion.

The electrode substrate for the transparent light emitting device display according to an embodiment of this application is schematically illustrated in FIG. 1.

In an embodiment of this application, a channel is formed in a structure in which the signal electrode wiring portion passes between the (+) common electrode wiring portion and the (−) common electrode wiring portion and the electrode wire does not separately come out for each light emitting device pad portion and can be connected to the (+) common electrode wiring portion and the (−) common electrode wiring portion as a common electrode.

In an embodiment of this application, each light emitting device pad portion can be constituted by at least four electrode pad portions electrically connected to the first common electrode wiring portion, the second common electrode wiring portion, and the signal electrode wiring portion. According to an embodiment of this application, each light emitting device pad portion can be constituted by four electrode pad portions electrically connected to the first common electrode wiring portion, the second common electrode wiring portion, and the signal electrode wiring portion.

In an embodiment of this application, the four electrode pad portions can comprise two signal electrode pad portions, one first common electrode pad portion, and one second common electrode pad portion. Each of the two signal electrode pad portions can be provided at the end of the signal electrode wiring portion as a signal In-out pad portion of the light emitting device and the first common electrode pad portion and the second common electrode pad portion can be provided at the ends of the first common electrode wiring portion and the second common electrode wiring portion, respectively. The end has the light emitting device thereabove and means a region in which the light emitting device is electrically connected to the first common electrode wiring portion, the second common electrode wiring portion, and the signal electrode wiring portion.

Further, the electrode pad portion can additionally comprise at least one capacitor pad portion on the transparent substrate. In an embodiment of this application, the electrode pad portion can comprise two capacitor pad portions.

The capacitor pad portion is a pad to which a capacitor is attached and the capacitor can serve to stabilize current supplied to the light emitting device.

Each of FIGS. 2 and 3 below is a schematic illustration of an electrode pad portion of an electrode substrate for a transparent light emitting device display according to an embodiment of this application. FIGS. 2 and 3 illustrate a case where four electrode pad portions are provided and a case where two capacitor pad portions are provided, respectively.

More specifically, in FIGS. 2 and 3, A represents the (+) common electrode wiring portion, B represents the (−) common electrode wiring portion, and C represents the signal electrode wiring portion. Further, in FIGS. 2 and 3, electrode pad portions 1 and 2 as signal in-out pad portions of the light emitting device are electrode pad portions provided to be connected to the end of the signal electrode wiring portion are electrode pad portions, electrode pad portion 3 as a (+) pad portion of the light emitting device is an electrode pad portion provided to be connected to the end of the (+) common electrode wiring portion, and electrode pad portion 4 as a (−) pad portion of the light emitting device is an electrode pad portion provided to be connected to the end of the (−) common electrode wiring portion. Further, capacitor pad portion 5 is a capacitor (+) pad portion and capacitor pad portion 6 is a capacitor (−) pad portion.

The A, B, and C comprise the metal mesh pattern and the metal mesh pattern is not provided among the electrode pad portions 1 to 4. Further, each of the electrode pad portions 1 to 4 and the capacitor pad portions 5 and 6 do not comprise the metal mesh pattern and the entire region of each pad portion can be made of metal. More specifically, since the electrode pad portion and the capacitor pad portion are portions covered by the light emitting device through a solder process, the electrode pad portion and the capacitor pad portion do not comprise the metal mesh pattern and the entire region of each pad portion can be made of metal.

Each of the interval between the electrode pad portions and the interval between the capacitor pad portions can be independently 0.1 mm to 1 mm. The interval is provided to prevent the sort by considering a tolerance at the time of screen printing of a solder paste for forming the light emitting device afterwards.

The shapes of the electrode pad portion and the capacitor pad portion are not particularly limited and can be a rectangular shape. Further, the sizes of the electrode pad portion and the capacitor pad portion can be 0.1 mm$^2$ to 1 mm$^2$, but are not limited thereto.

The four electrode pad portions can be joined to one light emitting device. That is, in an embodiment of this application, when multiple light emitting devices are provided on the transparent substrate, each light emitting device can be joined to four electrode pad portions.

In an embodiment of this application, all of the first common electrode wiring portion, the second common electrode wiring portion, and the signal electrode wiring portion can comprise the metal mesh pattern in which the line width, the line height, and the pitch are the same. In this application, a fact that the line widths of the metal mesh patterns are the same as each other means that a standard deviation of the line width is 20% or less, preferably 10% or less, and more preferably 5% or less. Further, in this application, a fact that the line heights of the metal mesh patterns are the same as each other means that the standard deviation of the line height is 10% or less, preferably 5% or less, and more preferably 2% or less. Further, in this application, a fact that the pitches of the metal mesh patterns are the same as each other means that the standard deviation of the pitch is 10% or less, preferably 5% or less, and more preferably 2% or less.

In an embodiment of this application, the metal mesh pattern can be provided in the entire region of the effective screen part on the transparent substrate except for a region where a light emitting device is provided. More specifically, the metal mesh pattern can be provided in a region having an area of 80% or more compared with the entire area on the transparent substrate or provided in an area of 99.5% or less. Further, the metal mesh pattern can be provided in a region having an area of 80% or more of an area except for an FPCB pad portion region and a light emitting device pad portion region provided on the transparent substrate or provided in an area of 99.5% or less, based on the entire area of the transparent substrate. In this application, the FPCB pad portion region can comprise an FPCB pad portion for applying external power and the area can be a total area of the FBCB pad portion or more or three times or less the total area of the FPCB pad portion. Further, in this application, the light emitting device part portion region can comprise an electrode pad portion and the area can be 1.5 time or more of the total area of the electrode pad portion or 3 times or less of the total area of the electrode pad portion.

In an embodiment of this application, the metal mesh pattern can satisfy Equation 2 below:

$$(P-W)^2/P^2 \geq 0.8. \quad \text{[Equation 2]}$$

In Equation 2 above, P represents the pitch of the metal mesh pattern and W represents the line width of the metal mesh pattern.

In an embodiment of this application, as the metal mesh patterns of the first common electrode wiring portion, the second common electrode wiring portion, and the signal electrode wiring portion, pattern types in the art can be used. More specifically, the metal mesh pattern can comprise polygonal patterns comprising one or more shapes among a triangle, a square, a pentagon, a hexagon, and an octagon.

The metal mesh pattern can comprise a straight line, a curved line, or a closed curve line configured by the straight line or the curved line.

Since the metal mesh pattern can be provided in the entire region of the effective screen part of the upper surface of the transparent substrate except for the region where the light emitting device is provided, a maximum wiring region which is allowed can be ensured, and as a result, the resistance characteristic of the transparent light emitting device display can be improved. More specifically, sheet resistance of the metal mesh pattern can be 0.1 Ω/sq or less.

The pitch of the metal mesh pattern can be 100 μm to 1,000 μm or 100 μm to 600 μm and 100 μm to 300 m, but the pitch can be adjusted according to transmittance or conductivity desired by those skilled in the art.

The material of the metal mesh pattern is not particularly limited, but preferably comprises at least one type of metal and a metal alloy. The metal mesh pattern can comprise gold, silver, aluminum, copper, neodymium, molybdenum, nickel, or an alloy thereof, but is not limited thereto.

The line height of the metal mesh pattern is not particularly limited, but can be 3 μm or more, 20 μm or less, or 10 μm or less in terms of the conductivity of the metal mesh pattern and an economic property of a forming process. More specifically, the line height of the metal mesh pattern can be 3 μm to 20 μm or 3 μm to 10 μm.

The line width of the metal mesh pattern can be 50 μm or less, 25 μm or less, 20 μm or less, but is not limited thereto. The smaller the line width of the metal mesh pattern, it can be advantageous in terms of transmittance and wire awareness, but resistance reduction can be caused and in this case, when the line height of the metal mesh pattern increases, the resistance reduction can be improved. The line width of the metal mesh pattern can be 5 μm or more.

An opening ratio of the metal mesh pattern, i.e., an area ratio not covered by the pattern can be 70% or more, 85% or more, or 95% or more.

According to an embodiment of this application, a metal mesh pattern in which the line width, the line height, and the pitch are the same is applied to the first common electrode wiring portion, the second common electrode wiring portion, and the signal electrode wiring portion to lower awareness of the wiring. When the line widths, the pitches, or the line heights of the metal mesh patterns of the first common electrode wiring portion, the second common electrode wiring portion, and the signal electrode wiring portion are not the same, the awareness of the wiring portion can undesirably increase.

In an embodiment of this application, the metal mesh patterns of the first common electrode wiring portion, the second common electrode wiring portion, and the signal electrode wiring portion can be respectively separated from each other by a disconnection portion without the metal mesh pattern. The disconnection portion means a region in which a part of the metal mesh pattern is disconnected to break an electrical connection. The width of the disconnection portion can mean a distance among most adjacent ends of the first common electrode wiring portion, the second common electrode wiring portion, and the signal electrode wiring portion which are spaced apart from each other. The width of the disconnection portion can be 80 μm or less, 60 μm or less, 40 μm or less, or 30 μm or less, but is not limited thereto. The width of the disconnection portion can be 5 μm or more.

A metal mesh pattern according to an embodiment of this application is schematically illustrated in FIG. 4 and a metal mesh pattern in the related art is schematically illustrated in FIG. 5.

Further a line width 80, a line height 90, and a pitch 100 of the metal mesh pattern according to an embodiment of this application are schematically illustrated in FIG. 6. The line width, the line height, and the pitch of the metal mesh pattern can be measured by using a method known to the art. For example, a method for measuring the line width, the line height, and the pitch by observing an SEM cross section, a method for measuring the line width, the line height, and the pitch with a non-contact surface shape measurer (optical profiler), a method for measuring the line width, the line height, and the pitch with a stylus surface step measurer (alpha step or surface profiler), etc., can be used. Further, the line width, the line height, and the pitch can be measured by a micrometer or a thickness gauge.

According to an embodiment of this application, the width of the disconnection portion which respectively separates the metal mesh patterns of the first common electrode wiring portion, the second common electrode wiring portion, and the signal electrode wiring portion is minimized to lower awareness of the wiring.

In an embodiment of this application, the metal mesh pattern can additionally comprise a blackening layer pattern. The blackening layer pattern can be provided on both the upper surface and the side surface of the metal mesh pattern. The blackening layer pattern can comprise at least one material of chromium-based, selenium-based, copper sulfide-based, copper oxide-based, nitride copper-based, copper sulfide-based, aluminum oxynitride-based, and copper oxynitride-based materials. The blackening layer pattern can be formed on the upper surface and the side surface of the metal mesh pattern by wet-coating the materials or formed by sputtering process of a material such as the aluminum oxynitride-based material, the copper oxynitride-based material, etc. in a thickness of 30 nm to 70 nm.

Further, the blackening layer pattern cannot be provided on the surface of the light emitting device pad portion.

In an embodiment of this application, the metal mesh patterns of the first common electrode wiring portion, the second common electrode wiring portion, and the signal electrode wiring portion can be respectively formed by an independent processing process or simultaneously formed by one printing process. As a result, the metal mesh patterns of the first common electrode wiring portion, the second common electrode wiring portion, and the signal electrode wiring portion can have the same line width, pitch, and line height as each other.

In an embodiment of this application, in order to form the metal mesh patterns of the first common electrode wiring portion, the second common electrode wiring portion, and the signal electrode wiring portion, the metal mesh patterns of the first common electrode wiring portion, the second common electrode wiring portion, and the signal electrode wiring portion which have a small line width and are precise can be formed on the transparent substrate by using a printing method. As the printing method, which is not particularly limited, a printing method such as offset printing, screen printing, gravure printing, flexo printing, ink jet printing, nano imprint, etc., can be used and one or more complex methods among them can be used. As the printing method, a roll to roll method, a roll to plate, plate to roll or plate to plate method can be used.

In an embodiment of this application a reverse offset printing method can be applied in order to implement a precise metal mesh pattern. To this end, in this application, a method can be performed, in which at the time of etching on a silicon based rubber called a blanket, ink which can serve as resist is coated over the entire area and then an unnecessary part is removed through an intaglio engraved with a pattern called primary cliche and a printing pattern remaining in the blanket is secondarily transferred to a substrate such as a film or glass on which metal is deposited and then a desired pattern is formed through sintering and etching processes. When such a method is used, as a metal deposited substrate is used, uniformity of the line height in the entire region is secured, thereby uniformly maintaining resistance in a thickness direction. Besides, in this application, a direct printing method can be comprised in which conductive ink is directly printed and sintered by using the reverse offset printing method described above to form a desired pattern. In this case, the line height of the pattern can be planarized by printing pressure of pressing and conductivity can be given by a thermal sintering process or a microwave sintering process/laser part sintering process for connection due to mutual surface fusion of metal nano particles.

In an embodiment of this application, the metal mesh patterns of the first common electrode wiring portion, the second common electrode wiring portion, and the signal electrode wiring portion can be formed by using a photolithography process. More specifically, the method can comprise plating the metal on the transparent substrate or exposing and developing a resist pattern having acid resistance on an upper portion laminated with a metal foil, etching the metal through the etching process, and releasing the resist pattern, but is not limited thereto.

In an embodiment of this application, in (M rows×N columns) light emitting device pad portions provided on the transparent substrate as the matrix, the pitch of the light emitting device pad portions constituting one row and the pitch of the light emitting device pad portions constituting one column can be the same as each other.

In an embodiment of this application, an interval between the adjacent light emitting device pad portions in the light emitting device pad portions constituting the one row, an interval between the adjacent light emitting device pad portions in the light emitting device pad portions constituting the one column, etc., can be changed by considering the used light emitting device and a resolution desired by a user.

In an embodiment of this application, an adhesive layer can be additionally comprised on the transparent substrate and each of the light emitting device pad portion, the first common electrode wiring portion, the second common electrode wiring portion, and the signal electrode wiring portion can be provided while being embedded in the adhesive layer.

That is, in an embodiment of this application, the light emitting device pad portion, the first common electrode wiring portion, the second common electrode wiring portion, and the signal electrode wiring portion can be provided on the transparent substrate in contact with the transparent substrate, the adhesive layer can be additionally comprised on the transparent substrate, and as a result, the light emitting device pad portion, the first common electrode wiring portion, the second common electrode wiring portion, and the signal electrode wiring portion can be provided while being embedded in the adhesive layer.

In an embodiment of this application, the adhesive layer can have a refractive index of 1.45 to 1.55 and have a fluidity at a temperature of 70° C. or more. Further, the adhesive layer can comprise a heat-curable adhesive composition or a UV-curable adhesive composition.

More specifically, the adhesive layer can comprise a silane-modified epoxy resin, a bisphenol A type phenoxy resin, an initiator and a silane coupling agent, but is not limited thereto.

The adhesive layer can be formed by using the adhesive composition and by a method such as comma coating, slot die coating, etc., but is not limited thereto.

In an embodiment of this application, a method for manufacturing an electrode of an embedded structure can comprise: forming a structure comprising a transparent substrate, an adhesive layer provided on the transparent substrate, and a metal layer provided on the adhesive layer; forming a light emitting device pad portion, a first common electrode wiring portion, a second common electrode wiring portion, and a signal electrode wiring portion by patterning the metal layer; and embedding the light emitting device pad portion, the first common electrode wiring portion, the second common electrode wiring portion, and the signal electrode wiring portion in the adhesive layer by heat-treating the structure at a temperature of 70° C. to 100° C.

In an embodiment of this application, line resistance of the first common electrode wiring portion or the second common electrode wiring portion connected to the light emitting device pad portions constituting one row among the light emitting device pad portions satisfies Equation 1 below:

$$R<(200/N)-0.4. \qquad \text{[Equation 1]}$$

In Equation 1 above, R represents the line resistance (Ω) of the first common electrode wiring portion or the second common electrode wiring portion, and N represents a natural number of 1 or more.

The line resistance R is proportional to an electrode width D and inversely proportional to an electrode length L. Further, the electrode length L can be determined according to how large a pitch an LED number N exists in. In this application, since the electrode width D of the display is n times the LED pitch P (n represents a constant number of 0.1 to 1) and a horizontal pitch and a vertical pitch of the LED are the same as each other, a relationship thereof can be expressed as an equation of $R \propto (nP/NP)$ and finally, the electrode width D, the electrode length L, and the pitch P can have a relationship of an equation of $R \propto (n/N)$. That is, an inversely proportional relationship can be established in which the line resistance has the LED number as a variable and the present inventor derived Equation 1 above according to an electrode design and an LED number setting value of those skilled in the art based on the inverse proportional relationship.

As the line resistance, the line resistance between an FPCB pad portion provided at an end portion of the first common electrode wiring portion or the second common electrode wiring portion and a last light emitting device pad portion at one row can be measured. Further, as a device of measuring the line resistance, a device known to the art can be used and for example, the device of measuring the line resistance can use 289 TRUE RMS MULTIMETER of Fluke Inc., but is not limited thereto.

In an embodiment of this application, when the line resistance satisfies Equation 1, the resolution, the luminance, etc., of the transparent light emitting device display can be enhanced.

In an embodiment of this application, the transparent substrate can be a glass substrate or a transparent plastic substrate having excellent transparency, surface smoothness, ease of handling, and waterproofness, but is not limited thereto as long as it is a transparent substrate ordinarily used in an electronic device. Specifically, the transparent substrate can be made of glass; urethane resin; polyimide resin; polyester resin; (meta)acrylate-based polymer resin; and polyolefin-based resin such as polyethylene or polypropylene. Further, the transparent substrate can be a film having visible ray transmittance of 80% or more, such as polyethylene terephthalate (PET), cyclic olefin polymer (COP), polyethylene naphthalate (PEN), polyethersulfone (PES), polycarbonate (PC), acetyl celluloid, etc. The thickness of the transparent substrate can be a 25 μm to 250 μm, but is not limited thereto.

Further, an embodiment of this application provides a transparent light emitting device display comprising an electrode substrate for a transparent light emitting device display.

The transparent light emitting device display can have a structure in which the solder is provided on the light emitting device pad portion of the electrode substrate for the transparent light emitting device display and the light emitting device is provided on the solder. A method for manufacturing the transparent light emitting device display can adopt a method known to the art except for using the electrode substrate for the transparent light emitting device display according to this application.

Hereinafter, an embodiment disclosed in this specification will be described through Examples. However, scopes of the embodiments are not intended to be limited by the following Examples.

EXAMPLES

Examples 1 to 4 and Comparative Examples 1 to 4

A fabric in which a transparent film (Polyester Film Q65HA of TEIJIN Inc.) is plated with Cu and dry film resist (DFR) (SPG-152 of Asahi Chemical Industry) were laminated.

Thereafter, a pattern mask was placed and exposed and then developed to leave a desired DFR pattern. Thereafter, Cu etching was performed and DFR releasing was performed to manufacture a desired Cu wiring pattern. The Cu wiring pattern was formed in a structure of FIG. 1.

In order to differentiate the line resistance of the example and the line resistance of the comparative example, the line width of the Cu wiring pattern of the example was set to 24 μm and the line width of the Cu wiring pattern of the comparative example was set to 16 μm. The example and the comparative example are the same as each other in terms of the pitch of 300 m, the height of 8 m, and the width of the disconnection portion of 60 m.

In the Examples and Comparative Examples, each electrode width is 0.5 times that of each LED interval, and the electrode length, the LED interval, the number of LEDs are shown in Table 1 below.

The low temperature solder paste was screen-printed to the electrode pad portion and then each LED was mounted on the solder paste. Thereafter, through the solder paste reflow process at about 170° C., the metal of the solder paste was bonded by binding the electrode pad portion and the LED pad portion.

In addition, the line resistance was measured at an FPCB pad portion provided at the end of the common electrode and the last LED pad portion, and a measuring device used 289 TRUE RMS MULTIMETER of Fluke Co., Ltd. In addition, evaluation of LED lighting in Table 1 below was based on the lighting of the last LED in one row.

TABLE 1

|  | Line resistance (Ω) | Electrode length (mm) | LED interval (mm) | LED number (number) | LED lighting |
| --- | --- | --- | --- | --- | --- |
| Example 1 | 6.0 | 672 | 24 | 28 | OK |
| Example 2 | 4.0 | 480 | 12 | 40 | OK |
| Example 3 | 2.8 | 672 | 12 | 56 | OK |
| Example 4 | 8.5 | 480 | 24 | 20 | OK |
| Comparative Example 1 | 8.0 | 672 | 24 | 28 | NG |
| Comparative Example 2 | 5.5 | 480 | 12 | 40 | NG |
| Comparative Example 3 | 4.0 | 672 | 12 | 56 | NG |
| Comparative Example 4 | 11 | 480 | 24 | 20 | NG |

Based on these results, according to an embodiment of the present application, line resistance of the first common electrode wiring portion or the second common electrode wiring portion connected to the light emitting device pad portions constituting one row among the light emitting device pad portions satisfies Equation 1 above, thereby designing the number of LEDs, an LED interval, an electrode length and the like without defects in the LED lighting.

The invention claimed is:

1. An electrode substrate for a transparent light emitting device display comprising:
    a transparent substrate;
    a M rows×N columns matrix of light emitting device pad portions provided on the transparent substrate; and
    a first common electrode wiring portion, a second common electrode wiring portion, and a signal electrode wiring portion provided on the transparent substrate,
    wherein each of the first common electrode wiring portion, the second common electrode wiring portion and the signal electrode wiring portions is connected to the light emitting device pad portions, wherein each of the first common electrode wiring portion, the second common electrode wiring portion, and the signal electrode wiring portion comprises a metal mesh pattern, and wherein a line resistance of the first common electrode wiring portion or the second common electrode wiring portion connected to the light emitting device pad portions in one row of the matrix of light emitting device pad portions satisfies Equation 1 below:

$$R<(200/N)-0.4 \qquad \text{[Equation 1]}$$

wherein in Equation 1, R is a line resistance (Ω) of the first common electrode wiring portion or the second common electrode wiring, and N and M are natural numbers of 1 or more.

2. The electrode substrate of claim 1, wherein a standard deviation of a line width of the metal mesh pattern of each of the first common electrode wiring portion, the second common electrode wiring portion and the signal electrode wiring portion is 20% or less, wherein a standard deviation of a pitch of each of the first common electrode wiring portion, the second common electrode wiring portion and the signal electrode wiring portion is 10% or less, and wherein a standard deviation of a line height of each of the first common electrode wiring portion, the second common electrode wiring portion and the signal electrode wiring portion is 10% or less.

3. The electrode substrate of claim 1, wherein the metal mesh pattern is provided in a region having an area of 80% or more of a total area of the transparent substrate.

4. The electrode substrate of claim 1, wherein each light emitting device pad portion comprises at least four electrode pad portions electrically connected to the first common electrode wiring portion, the second common electrode wiring portion and the signal electrode wiring portion.

5. The electrode substrate of claim 4, wherein the at least four electrode pad portions comprise two signal electrode pad portions, one first common electrode pad portion, and one second common electrode pad portion.

6. The electrode substrate of claim 1, wherein the light emitting device pad portions in one row of the matrix of light emitting device pad portions is connected in series with the signal electrode wiring portion.

7. The electrode substrate of claim 1, wherein the signal electrode wiring portion is provided between the first common electrode wiring and the second common electrode wiring portion.

8. The electrode substrate of claim 1, wherein the metal mesh pattern satisfies Equation 2 below:

$$(P-W)^2/P^2 \geq 0.8. \qquad \text{[Equation 2]}$$

wherein in Equation 2, P represents a pitch of the metal mesh pattern and W represents a line width of the metal mesh pattern.

9. The electrode substrate of claim 1, wherein the metal mesh pattern has a line width of 50 μm or less, a pitch of 100 μm to 1,000 μm, and a line height of 3 μm or more.

10. The electrode substrate of claim 1, wherein the metal mesh patterns of each of the first common electrode wiring portion, the second common electrode wiring portion, and the signal electrode wiring portion are respectively separated from each other by a disconnection portion and a width of the disconnection portion is 80 μm or less, and wherein the disconnection portion does not include the metal mesh pattern.

11. The electrode substrate of claim 1, wherein a material of the metal mesh pattern comprises gold, silver, aluminum, copper, neodymium, molybdenum, nickel, or an alloy thereof.

12. The electrode substrate of claim 11, wherein the metal mesh pattern additionally comprises a blackening layer pattern.

13. The electrode substrate of claim 1, further comprising:
flexible printed circuit board (FPCB) pad portions connected to each of the first common electrode wiring portion, the second common electrode wiring portion and the signal electrode wiring portion.

14. The electrode substrate of claim 1, wherein in the matrix of the light emitting device pad portions provided on the transparent substrate,
a pitch of the light emitting device pad portions of one row is the same as a pitch of the light emitting device pad portions of one column.

15. The electrode substrate of claim 1, wherein an adhesive layer is additionally provided on the transparent substrate, and
wherein each of the first common electrode wiring portion, the second common electrode wiring portion, and the signal electrode wiring portion is embedded in the adhesive layer.

16. The electrode substrate of claim 15, wherein a light emitting device pad portion connected to the first common electrode wiring portion, the second common electrode wiring portion, and the signal electrode wiring portion is embedded in the adhesive layer, and
wherein an upper surface of the light emitting device pad portion is exposed on the adhesive layer.

17. A transparent light emitting device display comprising the electrode substrate of claim 1.

* * * * *